United States Patent [19]

Little

[11] 4,386,505
[45] Jun. 7, 1983

[54] REFRIGERATORS

[75] Inventor: William A. Little, Palo Alto, Calif.

[73] Assignee: The Board of Trustees of the Leland Stanford Junior University, Stanford, Calif.

[21] Appl. No.: 354,616

[22] Filed: Mar. 4, 1982

Related U.S. Application Data

[63] Continuation-in-part of Ser. No. 259,687, May 1, 1981, abandoned, which is a continuation-in-part of Ser. No. 23,245, Mar. 23, 1979, abandoned.

[51] Int. Cl.³ ............................................. F25B 19/00
[52] U.S. Cl. .......................... 62/514 R; 29/157.3 D; 156/633; 165/168; 165/185
[58] Field of Search ............... 62/6, 514 R; 29/157.30; 165/185, 168; 156/633

[56] References Cited

U.S. PATENT DOCUMENTS 3,782,132  1/1974  Lohoff .................................. 165/185

FOREIGN PATENT DOCUMENTS 2708270  8/1978  Fed. Rep. of Germany ...... 165/168
1439080  6/1976  United Kingdom ................ 156/633

Primary Examiner—Ronald C. Capossela
Attorney, Agent, or Firm—LeBlanc, Nolan, Shur & Nies

[57] ABSTRACT

A multilayer miniature low temperature refrigerator wherein a cooling chamber for a device to be continuously cooled is connected to an input and an output by micron sized channels or like passages in respective different interfaces of a laminate of glass or like plates.

22 Claims, 23 Drawing Figures

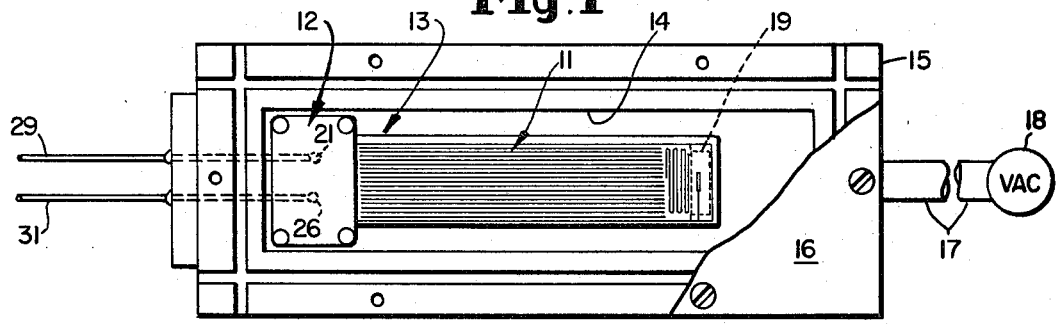
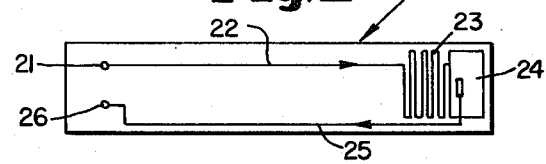
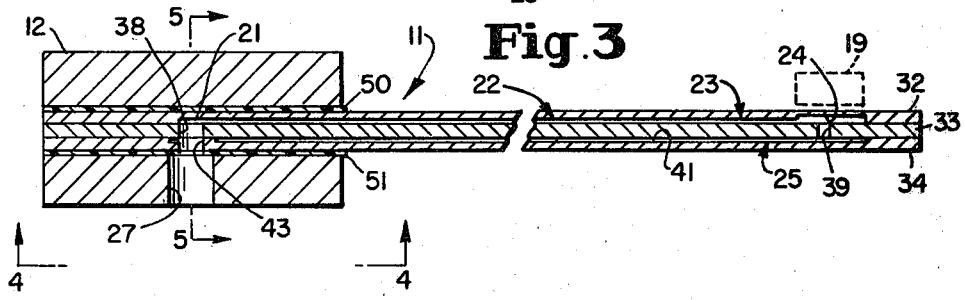
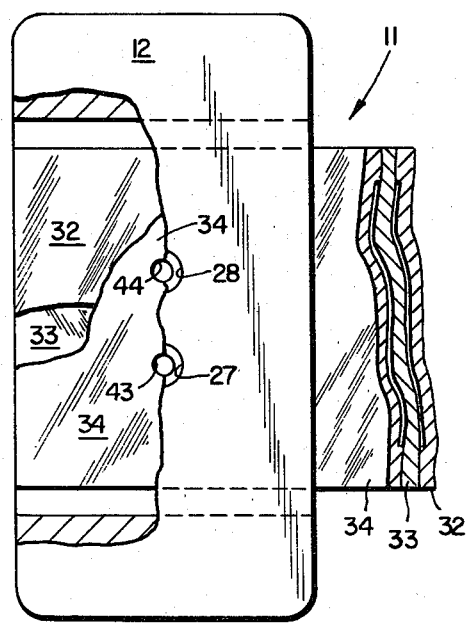
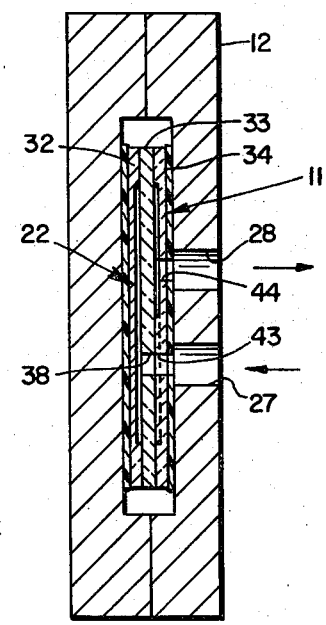

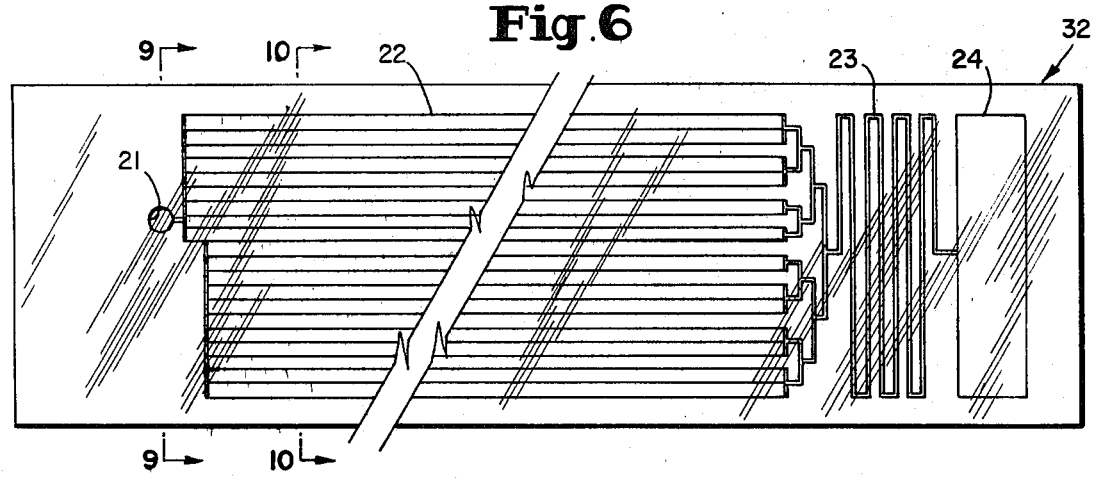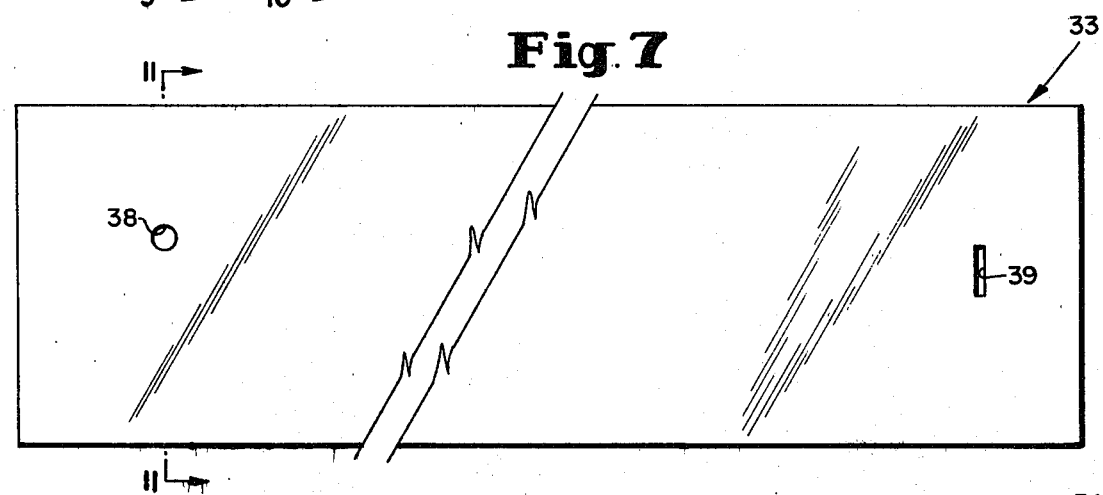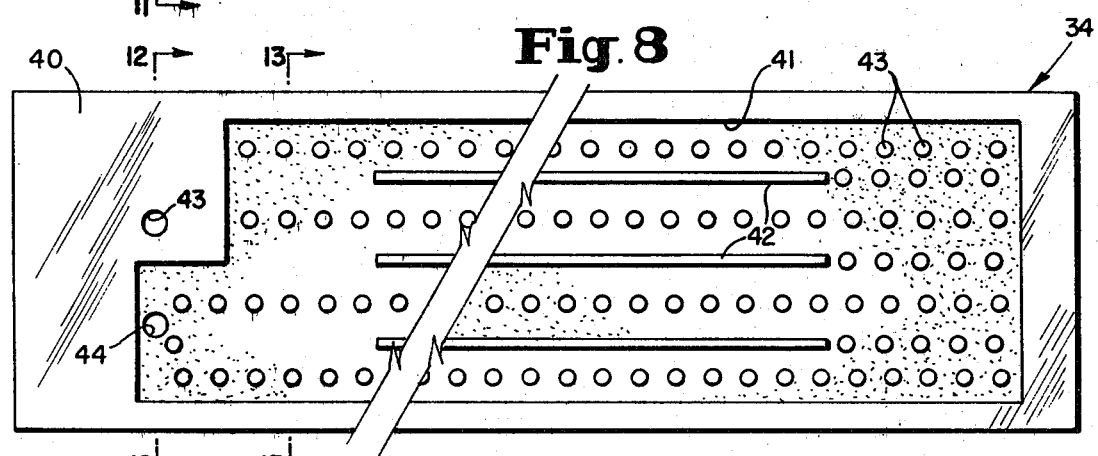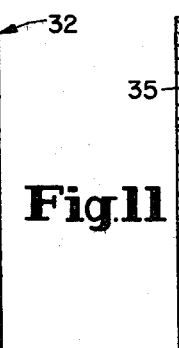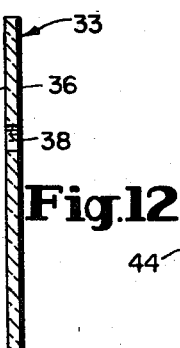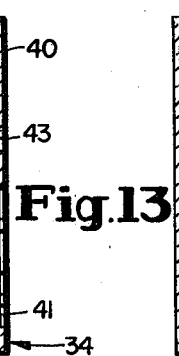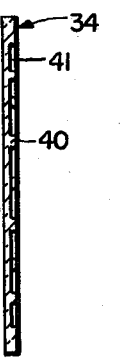

REFRIGERATORS

This application is a continuation-in-part of pending application Ser. No. 259,687 filed May 1, 1981 which in turn is a continuation-in-part of application Ser. No. 23,245 filed Mar. 23, 1979, both now abandoned. Related developments are disclosed in copending application Ser. No. 259,688 filed May 1, 1981.

BACKGROUND

This invention relates generally to refrigeration and more particularly to microminiature refrigerators and modes of assembly.

Certain materials, called superconductors, have the ability to pass electric current without resistance. Since superconductivity is observed only at temperatures close to absolute zero, one of the main obstacles to extensive use of superconducting devices is the need for reliable, continuous refrigeration. Superconducting devices, such as supersensitive magnetometers, voltmeters, ammeters, voltage standards, current comparators, etc., require a cryogenic environment to operate. Traditionally this has been provided by a bath of liquid Helium. The Helium is liquified elsewhere and transported to, and transferred to the device Dewar. The labor and complexity of such an operation has severely limited the use of these devices. Many of the above superconducting devices dissipate only a few microwatts in operation while the available cryogenic systems provide a refrigeration capacity of watts, thus the devices are poorly matched to the refrigeration.

In addition, many devices such as optical microscope stages, x-ray diffraction sample holders, electron microscope cold stages, devices for cryosurgery in the brain, for ECG, MCG and EKG measurements, and low noise amplifiers, require or benefit from subambient operating temperatures.

Additionally, there are a number of high speed, high power devices such as VLSI (very large scale integration) chips and transmitters that are small, on the order of a centimeter square, and dissipate large amounts of heat, on the order of 10 to 50 watts. Traditional cooling devices, such as fans for convection cooling, are not capable of dissipating this amount of heat without significant increases in temperature above ambient.

Miniature closed cycle refrigerators such as those based on the Gifford-McMahon cycle, Vuilleumier, Stirling, etc., have been developed. These refrigerators with capacities in the range of 0.5–10 watts, are convenient and compact but, because of their moving parts, they introduce a large amount of vibration and magnetic noise which interferes with the operation of the devices. Miniature Joule-Thomson refrigeration systems have been developed which have a cooling capacity typically between 0.5–10 watts. The design configurations of these compact systems are generally helically finned tubes coiled around a mandrel, the high-pressure gas flowing inside the tubes and the low-pressure gas flowing outside the tubes. Such helically finned and coiled heat exchangers are fabricated by laborious welding or soldering of the individual components. Because of the intricacy of the device, microminiature refrigerators with milliwatt capacities until now have not been made.

What is needed for many devices is a microminiature refrigerator of approximately ½" to 4" in size with a cooling capacity in the milliwatt range. Also needed are microminiature refrigerator fabrication methods which avoid conventional laborious welding or soldering techniques and allow the formation of very small gas lines to operate the heat exchangers in the laminar flow regime and still have an efficient exchange of heat. The consequent absence of turbulence in the gas stream eliminates vibration and noise, both important considerations for superconducting device applications. The miniature size would allow the incorporation of an entire cryogenic system-superconducting sensor as a hybrid component in electronic circuitry. The microminiature refrigeration capacity would allow the matching of the refrigeration system to the load. The invention solves many of these problems.

Also needed are microminiature refrigerators of the same general dimensions as discussed above that can dissipate large amounts of heat, 10–50 watts, generated by certain small devices while maintaining ambient or subambient operating temperatures. And such refrigerators should be easy to manufacture and in configurations that are compatible with standard electronic packaging.

As explained in greater detail below, the microminiature refrigerator of the present invention comprises, in a unique form and scale a plurality of sealed plate-like members which form between them a cooling chamber, a heat exchanger capillary passage and fluid passages for conveying incoming high pressure gas successively through the heat exchanger the capillary section and into the cooling chamber. Return or outflow passages conduct the fluid from the cooling chamber through the heat exchanger in counterflow relation with the incoming gas and then to the exterior of the device.

Such a microminiature refrigerator requires scaling down a conventional refrigerator by a factor of about a thousand. The design perameters for a microminiature refrigerator of the same efficiency as a conventional refrigerator using turbulent flow are described in "Scaling of Miniature Cryocoolers to Microminiature Size," by W. A. Little, published in NBS Special Publication in April, 1978, which is hereby incorporated by reference.

In summary, the diameter d of the heat exchanger tubing, l the length of the exchanger and t the cooldown time are related to the capacity which is proportional to m the mass flow, in the following manner:

$$d \simeq (\dot{m})^{0.5}$$

$$l \simeq (\dot{m})^{0.6}$$

$$t \simeq (\dot{m})^{0.6}$$

A microminiature turbulent flow refrigerator with a capacity of a few milliwatts should have $d = 25\mu$ and l a few centimeters.

As the device becomes smaller and smaller, eventually the mass flow becomes too small to allow turbulent flow of the fluid to occur. Laminar flow operation then becomes possible without loss of refrigeration efficiency.

The theoretical basis for designing microminiature refrigerators using laminar flow heat exchangers is discussed in "Design Considerations for Microminiature Refrigerators Using Laminar Flow Heat Exchangers," presented by W. A. Little at the Conference on Refrigeration for Cryogenic Sensors and Electronic Systems, Boulder, Colo., Oct. 6 and 7, 1980, which is hereby incorporated by reference.

For microminiature heat exchangers operating in the laminar flow region over the same pressure regime and having the same efficiency, the length of the exchanger (l) should be made proportional to the square of the diameter (d) of the exchanger tubing. For example, a Joule-Thomson exchanger operating with $N_2$ at 120 atmospheres, with a capillary channel passage 5 cm long, 110 microns wide and 6 microns deep, should provide approximately 25 milliwatts cooling. Different refrigeration capacities and operating temperatures can be obtained by varying the width of the channel and/or refrigerant used. For example, ammonia can be used to provide a cooling capacity of 50 watts or more at $-30°$ C. One may thus operate under streamline conditions free of vibration and turbulence noise, an advantage, particularly for superconducting devices, which require a very low noise environment.

To increase the efficiency of the refrigerator for certain applications one form of the invention provides two capillary sections arranged in series or in parallel and passages for conducting a substantial portion of the gas directly to the outflow passage of the heat exchanger after passage through only one of the capillary sections.

In order to construct microminiature refrigerators, new fabrication techniques are needed for producing heat exchangers and expansion nozzles, a factor of 100 to 1,000 times smaller than those of conventional refrigerators.

Conventional fabrication techniques are ill-suited for microminiaturization since channels of the order to 5–500 microns must be formed accurately and the device must be sealed so as to withstand high pressure of the order of 150–3000 psi for refrigeration efficiency.

Accordingly, the major object of the invention is to provide a novel microminiature refrigerator particularly for cryogenic cooling and mode of assembly.

Another object of the invention is to provide a novel microminiature refrigerator with a cooling capacity ranging from milliwatts up to 50 watts or more.

Another object of the invention is a novel multilayer microminiature refrigerator.

Another object of the invention is to provide a novel refrigerator assembly having two or more multilayer refrigerators for cascade cooling to reach low cryogenic temperatures.

A further object of the invention is to provide a novel microminiature refrigerator composed of three or more similar plates of glass or equivalent material assembled in a stack with micron-sized fluid flow high-pressure inlet and low-pressure outlet passages connected to a cooling chamber and being arranged in separate layers at interfaces between adjacent plates.

Further to this object it is contemplated that in a lamination of three plates high-pressure inlet, heat exchange and capillary expansion passage sections are formed in series in one plate surface-bonded to an intermediate plate, one surface of which forms one side of the passages and low-pressure pressure return recess means is formed in the surface of the other plate that is bonded to said intermediate plate.

Another object of the invention is to provide a novel refrigeration assembly having a special mounting and gas passage defining holder at one end, as for mounting the refrigerator to extend cantilever fashion within an evacuated enclosure.

Further objects of invention will appear as the description proceeds in connection with the appended claims and the accompanying drawings.

In accordance with the invention, a microminiature refrigerator and method of making the same is provided. It should be noted that the microminiature refrigerator can be scaled up both in size and capacity for certain applications. The refrigerator is novel, irrespective of size; however, it is the miniaturization of the refrigerator that is difficult and therefore this is described in detail here. The turbulent or laminar flow microminiature refrigerator includes one or more plates on some of which micron-sized gas channels are formed and completed by one or more bonded plates resistant to high pressures. The microminiature refrigerator may be used for, but is not limited to, cryogenic refrigeration.

BRIEF DESCRIPTION OF DRAWINGS

FIG. 1 is a plan view illustrating a use and environment of the refrigerator of the invention;

FIG. 2 is a schematic view illustrating the fluid circuit in the refrigerator of the invention;

FIG. 3 is an illustration section showing the laminated nature of the refrigerator and the multilayer fluid flow paths, details of which according to preferred embodiments are shown in later Figures;

FIG. 4 is a plan view partly broken away showing a refrigerator holder;

FIG. 5 is a section substantially on line 5—5 of FIG. 4;

FIGS. 6, 7 and 8 are top plan views of the three (upper, middle and lower) elements that comprise the laminate or sandwich construction of the refrigerator of the invention according to a preferred embodiment particularly illustrating the various fluid flow passages and chambers;

FIGS. 9 and 10 are sections substantially along lines 9—9 and 10—10 in FIG. 6;

FIG. 11 is a section substantially along lines 11—11 of FIG. 7;

FIGS. 12 and 13 are sections substantially along lines 12—12 and 13—13 in FIG. 8;

PREFERRED EMBODIMENTS

Figure 14:
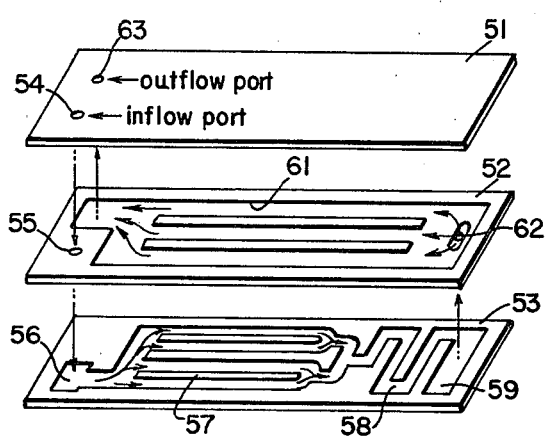
FIG. 14 is an exploded view showing an embodiment wherein the flow passages are differently located.

Referring to FIG. 1 the refrigerator 11 is mounted at one end in a holder 12 within which it is fixed so that the refrigerator and holder usually comprise a unitary assembly indicated at 13.

In the illustrated assembly, the refrigerator contains flow passages that are connected through the holder to fluid inlet and outlet means.

FIG. 1 shows the assembly mounted in a well 14 of a typical boxlike enclosure 15 having a suitable airtight cover indicated at 16. In the enclosure the holder 12 is affixed suitably at the bottom of the well and the refrigerator extends cantilever fashion through the well. Preferably the well is subjected to subatmospheric pressure through the conduit 17 leading to a source of vacuum 18.

The device 19 to be continuously cooled which may be a small superconductor chip or like device is suitably mounted within the well 14 preferably in contact with the coolest region of the refrigerator as indicated in dotted lines in the drawings and any wiring therefrom (not shown) passes through sealed ports in the enclosure. In the illustrated embodiment this device is preferably mounted in direct contact with the refrigerator glass surface that serves as a cover for chamber 24.

Referring to FIG. 2 the fluid path is at least schematically shown. The refrigerator 11 has an inlet port bore 21 for admitting highly compressed gas that flows through a passage having heat exchange section indicated at 22 and a smaller diameter capillary section 23 into a cooling chamber 24. The device 19 to be cooled is located as closely as possible to chamber 24, which is the coolest part of the refrigerator as will appear, and fluid leaving the chamber 24 returns along a passage 25 extending adjacent and in heat exchange relation to the inlet passage section 22 and leading to an outlet port 26. These passages are micron-sized for very low temperature refrigerations of milliwatt capacity as will appear.

In the invention inlet port 21 and outlet port 26 connect into bores 27 and 28 respectively in holder 12, and the holder is so mounted in the enclosure as to connect bores 27 and 28 with fluid inlet conduit 29 and fluid outlet conduit 31 projecting from the enclosure. Where the system is an open cycle refrigerator, conduit 29 is connected to a source of pressurized refrigerant gas and conduit 31 is connected to a suitable exhaust. In a closed cycle system the conduits 29 and 31 are connected through a loop containing a condensor and pressurizing assembly.

As shown best in FIG. 3 the refrigerator 11 comprises a three-element sandwich consisting essentially of three bonded similar accurately flat glass or other similarly low thermally conductive plates 32, 33 and 34 of approximately the same length and width, having thickness preferably in the order of 0.020". The middle plate may be thinner than the others to enhance the heat exchange between inflow and outflow channels. The refrigerator 11 may overall be about ½" wide and 2¼" long with a total thickness of about 0.060", this representing a workable embodiment that has been successfully tested. Another workable embodiment is 0.2" wide, 1.0" long and 0.060" thick.

The refrigerator is of multilayers construction. That is, the fluid supply passages 22 and 23 and the chamber 24 are formed to provide one fluid flow passage layer within the sandwich substantially in one plane while the return passage is formed to provide a separate fluid flow passage layer within the sandwich substantially in a spaced plane. As will appear these layers are in fluid flow connection through an opening in the chamber wall.

FIGS. 6–13 illustrate detail of a preferred embodiment. The thin flat glass plates 32, 33 and 34 are of the same size. The intermediate glass plate 33 is smooth with opposite flat smooth coplanar surfaces 35 and 36 (FIG. 11). The upper plate 32 as illustrated is transparent. As shown in FIG. 6, plate 32 has recessed regions or channels in its bottom surface 37 defining the inlet port 21, the heat exchange passage section 22, the capillary passage section 23 and the chamber 24 connected in series providing a continuous fluid flow path from the inlet port 21 to chamber 24. Port 21 is in the nature of a closed bottom well.

Intermediate plate 33 closes one side of the passages in plate 32, and at one end it has a through bore 38 aligned with port 21 of plate 32 in the assembly. Plate 33 at the other end has a through port 39 aligned with chamber 24 in the assembly.

Bottom plate 34 which is formed on its top surface 40 with the low-pressure fluid return path that comprises a generally rectangular large area surface recess 41. A series of spaced ribs 42 and several rows of projections 45 are provided on the bottom of recess to supportingly contact the lower surface 36 of the intermediate plate in the assembly while not interfering appreciably with fluid flow. Plate 34 is formed with a through bore 43 that aligns with bores 38 and 21 in the assembly of FIG. 5. A second bore 44 in plate 34 opens into recess 41. Fluid exhausted from chamber 24 in the assembly passes through port 39 into recess 41 and exhausts through port 44.

In the assembly glass plates 32 and 33 and 34 are bonded in the stack pressure tight at their interfaces. This laminate is placed in holder 12 where one end is bonded to the metal holder by adhesive layers 49 and 50 with ports 43 and 44 in alignment with bores 27 and 28 respectively. This provides support for the refrigerator and sealed leakproof inlet and outlet connections for the refrigerator flow passages.

The passage sizes are selected for cooling capacities.

The passages 22, 23 and 25 are micron-sized. In the invention the passages 22 and 23 particularly are micron-sized having dimensions in the order of 5-500 microns. In a typical refrigerator these passages may be as shallow as 5-10 microns and as narrow as 150-200 microns. In passage 22 the gas passes in laminar flow, thereby reducing vibration, noise and other problems incident to turbulent flow. Recess 41 is typically about 20-40 microns deep.

In a modification of the foregoing the inlet and outlet passage means may be recessed or otherwise formed in opposite surfaces of intermediate plate 33, or one of the passage means formed in plate 33, while the other is formed in one of the other two plates.

In operation in FIGS. 1–13, compressed gas such as nitrogen or ammonia at ambient temperature (60° F.–90° F.) is introduced through line 29 and port 21. These gas pressures are in the region of about 150–3000 pounds per square inch.

The gas flows through the heat exchange section 22 of the micron-sized passageways and then through the smaller cross section capillary section 23 where the gas expands and reduces in temperature and enters cooling chamber 24. The fluid in chamber 24 may be supercooled gas, liquid or a mixture, and in any event this is the coolest part of the refrigerator.

Fluid leaving chamber 24 through port 39 flows at reduced pressure through the return passage 25 in heat exchange relation with inlet passage 22 and then to outlet port 26 and line 31. It will be noted that this heat exchange takes place substantially directly through the small uniform thickness of the intermediate glass plate 33 and is efficient and accurate, the cool low-pressure outgoing gas precooling the incoming highly compressed incoming gas.

In the invention the heat exchange between the heat exchange sections of the high-pressure gas passages and the low-pressure return passages takes place through walls having the dimension of the thickness of respective plates whereby accurate relative location is possible, the heat exchange being controlled by the thickness of plate.

One of the major advantages in providing the laminar flow low-pressure return in a separate layer is that the refrigerator may operate at a lower temperature than refrigerators designed for turbulent flow in the return passage. This results because the laminar flow channels produce lower back pressures and hence lower operating temperatures.

Experience has shown that multilayer refrigerators of the foregoing type may be designed using up to one-third less material volume than a single-layer refrigerator (single-layer is where inlet and return passages are formed in one interface) of the same cooling capacity, and hence operate more efficiently.

Plates 32, 33 and 34 are preferably of soda lime glass, Pyrex or other similarly low thermally conductive material. They must be flat, of low thermal conductivity and capable of being worked to form the surface recess passages and chamber above described. This is particularly desirable where cooling down to −50° C. or below is required. However, when the required temperature is not so low, it is preferable to provide a top plate of a very high conductivity material but about the same coefficient of thermal expansion such as beryllium oxide, silicon or a crystalline aluminum oxide whereby to effect a more efficient exchange of heat.

In some embodiments the high-pressure inlet passage system and the low-pressure passage system may be etched or otherwise recessed into opposite sides of the intermediate plate, while the other two plates of the stack are planar-surfaced to close the recess sides. Also it is within the scope of the invention to provide one layer (high- or low-pressure passageways) in the intermediate plate and the other layer in one of the top or bottom plates.

FIG. 14 discloses an embodiment wherein three similar plates 51, 52 and 53 about 0.020 inches thick provide the micron-sized passages. The plates are bonded in a stack in use, but are here shown in exploded view to better illustrate detail of the refrigerator components.

The high-pressure gas is introduced at inflow port 54 of plate 51 which is a flat glass plate with planar surfaces, and continues through bore 55 in plate 52 to a closed bottom well 56 in the upper surface of lower plate 53 which may be the same as plate 32 of FIGS. 1-13. The higher pressure circuit continues in plate 53 as a heat exchange section 57 and a capillary expansion section 58 opening into the cooling chamber recess 59.

Intermediate plate 52 which may be the same as plate 34 of FIGS. 1-13 is flat and planar on its bottom surface to complete the passages in plate 53, and its upper surface is recessed at 61 to provide the low-pressure return. A through bore 62 in the bottom of recess 61 connects chamber 59 to the return circuit. A through port 63 in upper plate 51 connects the low-pressure recess 61 to an external circuit.

Figure 15:
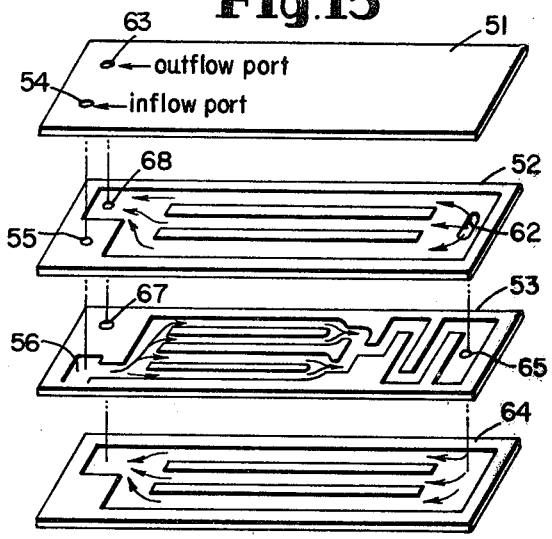
FIG. 15 is an exploded view showing an embodiment wherein two low-pressure flow paths are provided.

FIG. 15 shows an embodiment similar to FIG. 14 but providing two low-pressure returns. Four similar-sized plates are here bonded in a stack, shown exploded in FIG. 15 for clarity of disclosure. Plates 51, 52 and 53 are as in FIG. 14, and a fourth plate 64 is added to provide a second low-pressure return. Plate 64 may be a duplicate of plate 52 with the low-pressure return recess being formed in its upper surface. However, a through bore 65 in plate 53 in the bottom of chamber 59 connects the chamber to low-pressure recesses 66 in the upper surface of plate 64. Also, there is no bore corresponding to bore 62 in recess 66, but the low-pressure gas from recess 66 flows through a through bore 67 in plate 53 and a through bore 68 in plate 52 to join the exhaust gas from recess 61 in passing to outflow port 63.

Thus in this embodiment there are two heat exchange paths providing quicker and lower precooling of the incoming high-pressure gas.

Figure 16:
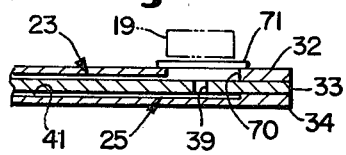
FIG. 16 is a fragmentary view showing a pad of increased thermal conductivity on the cool end of the refrigerator.

In the embodiment of FIG. 16, the cool end of the refrigerator 11 is modified to the extent that the cooling chamber instead of being a recess as at 24 in FIG. 3 is a through opening 70 in the cover glass plate 51, and over this opening is bonded pressure-tight a thin flat pad 71 of a material that has very high thermal conductivity. The device 19 to be cooled is mounted directly upon the pad 71. Thus the fluid at its lowest temperature contacts the undersurface of the pad 17.

Preferred materials for pad 71 are silicon, beryllium and sapphire. All have high thermal conductivities that increase dramatically at very low temperatures and can be matched to an appropriate plate material of about the same coefficient of thermal expansion. The preferred material is beryllium oxide. This material combines high hardness with a coefficient of thermal expansion closer to the preferred glass plate material.

Figure 17:
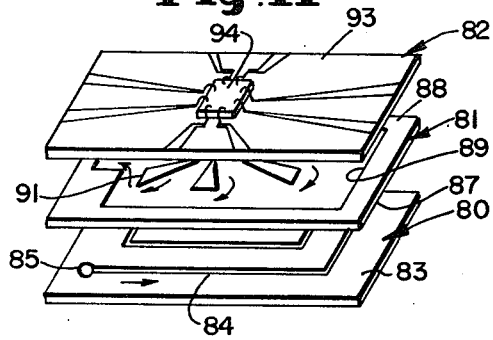
FIG. 17 is an exploded view showing a multilayer refrigerator according to a further embodiment.
Figure 18:
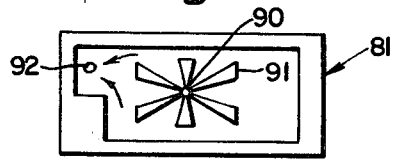
FIG. 18 is a plan view showing the plate of FIG. 17 in which the low-pressure gas passage means is formed.
Figure 19:
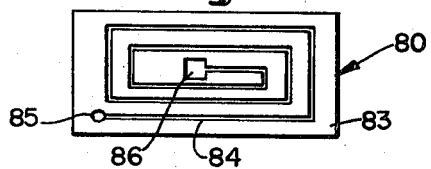
FIG. 19 is a plan view of the plate of FIG. 17 in which high-pressure passage means is formed.

FIGS. 17-19 illustrate another form of multilayer refrigerator operating on the same principle.

As shown in FIG. 17 the refrigerator laminate comprises three similar thin planar plates 80, 81 and 82 of a material that may be etched. Preferably plates 80 and 81 are glass plates and plate 82 may be of glass for many purposes but for other purposes may be of a higher thermal conductivity glasslike material such as crystalline aluminum oxide (sapphire), beryllium or silicon.

Upon the top surface 83 of plate 80 is etched or equivalently formed the high-pressure gas inlet passage means, here consisting essentially of a micron-sized capillary dimension recess 84 that travels from inlet port 85 in a labyrinth to a central recessed cooling chamber 86.

Plate 81 has a continuous planar bottom surface 87 bonded pressure-tight onto plate 80 to complete the inlet passage and chamber and in its upper surface 88 there is a large low-pressure gas return recess 89 connected to chamber 86 by a port 90. A series of raised radial ribs 91 in the recess 89 supportingly engage plate 80 to increase the mechanical strength of the assembly.

The outgoing gas at reduced pressure flows in recess 89 to an outlet port 92 that continues through one of the plates 80 or 82 to an external device as in the earlier embodiments.

As indicated in FIG. 17 the plate 82 is bonded pressure-tight onto plate 81 to complete the micron-sized deep return passage 89.

On the top surface 93 of plate 82 is directly secured the chip 94 to be cooled, and a printed or like circuit 95 for the chip extends over plate 82 to suitable external electrical connections. The chip is thus exposed to the cooled fluid at substantially the coldest region of the refrigerator. This mode of attaching the device to be cooled may be employed in all of the embodiments herein.

In the foregoing the capillary passage exhibits heat exchange relation with the fluid in exhaust recess 89. This arrangement may be preferable for higher temperature refrigeration where cooling to cryogenic temperatures is not required. For example, ammonia may be used as the refrigerant to achieve temperatures of $-30°$ C. and refrigeration capacities up to 50 watts. As the requirements approach cryogenic cooling a longer heat exchange region for precooling prior to the capillary section is provided. For example, the refrigerant may be Freon introduced at high pressure and which will drop in pressure, expand and cool in the capillary section 84 while in heat exchange relation with the return gas in recess 89 for further cooling. Where the gas is nitrogen for cryogenic cooling as in the embodiment of FIGS. 1–13, the longer precooling heat exchange region is provided.

The foregoing refrigerator may be of particular value in cooling larger computer chips such as those known as VLSI (very large scale integration) chips which today are being designed with greater circuit density and increased power capacity, thereby dissipating large amounts of heat, 10–50 watts. Refrigeration enabling them to operate at lower temperatures improves operating efficiency, speed and reliability, and increases useful life.

Figure 20:
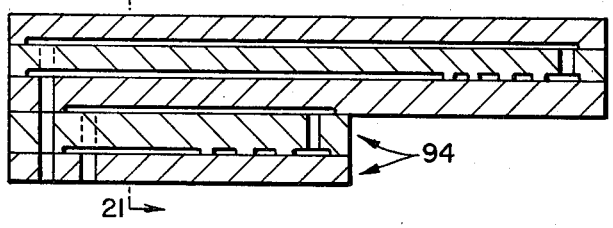
FIG. 20 is an illustration view showing the laminated nature of two multilayer refrigerators combined in one unit to provide cascade cooling.
Figure 21:
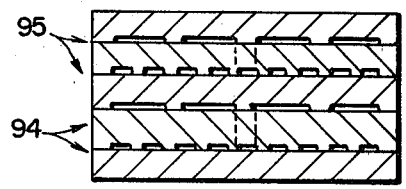
FIG. 21 is a section substantially along line 21—21 of FIG. 20.

FIGS. 20 and 21 illustrate a refrigerator unit consisting of two multilayer refrigerators constructed between five laminated plates. This configuration allows for cascade cooling—the precooling of one fluid by another to enable either faster cooldown or lower temperatures. For example, ammonia could be used in the first stage of the cascade, layers 94, to precool nitrogen in the second stage, layers 95. This will decrease the cooldown time for nitrogen by a factor of three or more. As another example, nitrogen could be used in the shorter stage, layers 94, to precool hydrogen which will then cool to 20 K. (Low boiling point fluids such as hydrogen and helium will not cool in the Joule-Thomson cycle unless they are precooled to the proper temperature in this manner.) Refrigerators having three or more stages can be constructed in a similar manner.

It has been discovered that there is a trade off between efficiency of the heat exchanger and the minimum temperature which can be reached in the cooling section of the refrigerator. The minimum temperature is determined by the gas pressure at the point at which the gas exits from the cooling chamber. The lower the pressure at this point, the lower the temperature. On the other hand, the heat exchanger efficiency is a function of the pressure drop along the outflow channel, an increase in the pressure drop producing more efficient heat exchange. Thus to obtain an efficient heat exchange which leads to faster cool down time and/or lower gas comsumption rates the pressure of the gas as it leaves the cooling chamber must be relatively high. Conversely, to effect maximum temperature drop in the cooling chamber the gas pressure at the same point should be relatively low.

Figure 22:
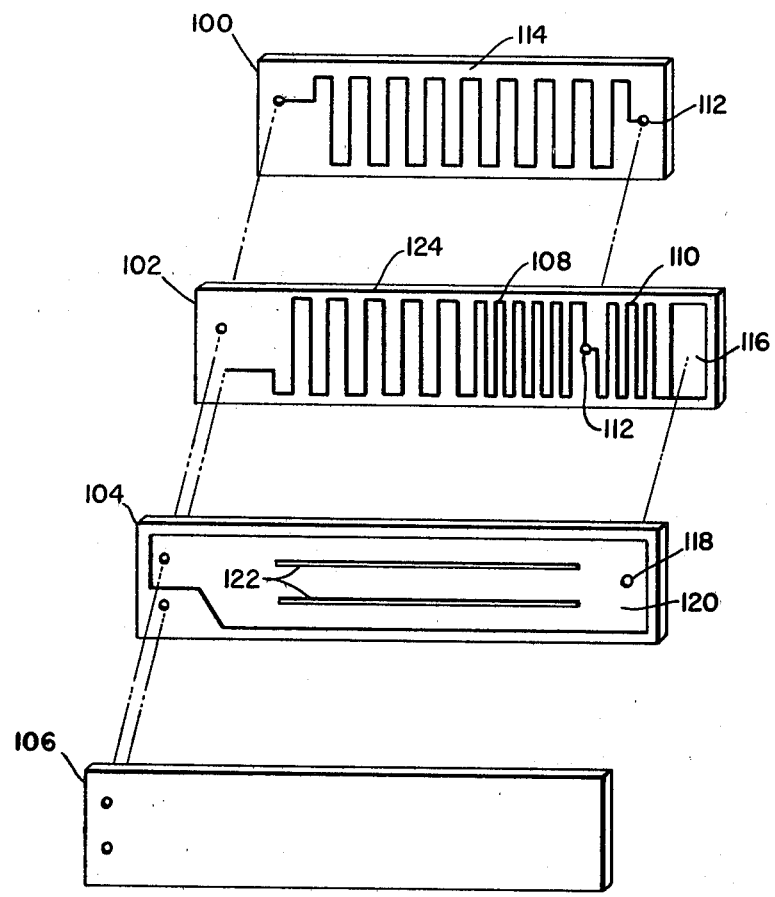
FIG. 22 is an exploded view of a further embodiment of the invention.
Figure 23:
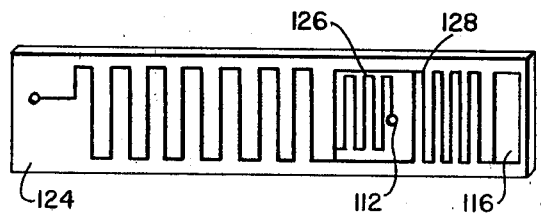
FIG. 23 is a plan view of one component of a further embodiment of the invention.

The embodiments of FIGS. 22 and 23 represent an effective solution to this problem. In each of these embodiments two capillary sections are provided and a portion of the incoming gas is by-passed directly to the outflow passage of the heat exchanger after passage through one of the capillary section thus by-passing the cooling chamber.

The embodiment of FIG. 22 comprises a stack of four plates, 100, 102, 104 and 106 which may be of the same materials and bonded together in the same manner as in the previously described embodiments. In this embodiment two capillary sections 108 and 110 are provided in series relationship. Between the two capillary sections a small port 112 is provided leading to the upstream end of the heat exchanger outflow passage 114 formed in plate 100. The downstream end of the second capillary section 110 is connected to the cooling chamber 116 which in turn is connected by a port 118 to a second outflow passage 120 formed by the recessed face of plate 104. Ribs 122 are provided in the plate 104 to impart stiffness to the unit and assure uniform spacing between the plates 104 and 106.

In operation, high pressure gas flows through the inflow section of the heat exchanger 124 and expands and drops in pressure as it flows thereafter through the first capillary section 108 to the port 112. At this point the gas flow is divided so that a substantial portion of the gas proceeds through the port 112 directly to the outflow heat exchanger passage 114.

The port 112 and the outflow passage 114 are so dimensioned that a relatively high pressure is maintained at the port 112, typically 10 to 30 atmospheres. Accordingly, a large pressure drop will occur in the outflow section 114 of the heat exchanger producing high efficiency of the heat exchange function.

The remainder of the gas flows through the second capillary section 110 to the cooling chamber 116. Here the gas absorbs heat from the device being cooled and then flows out through the port 118 and to the exterior of the device through the second outflow passage 120 at a relatively low pressure, typically 2 to 3 atmospheres. This low pressure assures achievement of the desired low pressure in the cooling chamber.

It has been found that both heat exchanger efficiency and the desired cooling can be achieved by permitting from 50% to as much as 95% of the gas to flow through the port 112 and the outflow heat exchanger passage 114.

FIG. 23 illustrates a plate 124 which may be substituted for the plate 102 in the embodiment of FIG. 22 to achieve similar results. In this form of the invention the two capillary sections. indicated at 126 and 128, are arranged in parallel rather than in series as in the embodiment of FIG. 22. The incoming gas passages through the inflow section of the heat exchanger 124 through the first capillary section 126 and through the port 112 for passage to the first outflow heat exchanger passage 114. The remainder of the gas passes through the second capillary section 128 into the cooling section 116 and thence into the alternate outflow passage 120. As in the previously described embodiment good results may be obtained by by-passing from 50 to 95% of the incoming gas through the port 112.

Other channel dimensions or characteristics of the refrigerator may be as disclosed in my copending application Ser. No. 259,688 filed May 1, 1981 entitled Micro Miniature Refrigerators. The formation of the channels and the bonding of the plates herein is accomplished by the channel-forming techniques and the bonding material disclosed in said application.

The invention may be embodied in other specific forms without departing from the spirit or essential characteristics thereof. For instance, multiple refrigerators can be fabricated in the same laminated substrate structure to cool multiple devices mounted on this structure. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by Letters Patent is:

1. A multilayer low temperature refrigerator comprising a pressure tight bonded laminate of at least three plates of glass or similarly low thermally conductive material, means forming high pressure gas inlet and low pressure gas return passage means in said laminate, said inlet and return passage means being spaced apart by at least one of said plates and extending in counterflow heat exchange relation, said inlet passage means including a capillary section and terminating in a cooling chamber, and means defining a fluid flow passage leading from the cooling chamber to the low pressure return passage means.

2. The refrigerator defined in claim 1, wherein at least said inlet passage means is of micron dimensions in cross section.

3. The refrigerator defined in claim 1 wherein said inlet passage means are channels having a width of about 5–500 microns wide and a depth of about 2–500 microns.

4. A multilayer microminiature refrigerator comprising a laminate of three planar-surfaced thin plates bonded pressure-tight at the interfaces between adjacent plates, means providing in one interface between two adjacent plates a first continuous inflow passage means extending from an inlet to a cooling chamber and including capillary passage means, means for connecting said inlet to a source of refrigerant gas at high pressure, means providing in the other interface between two adjacent plates a further continuous outflow passage menas leading to an outlet, and a passage interconnecting said chamber and said further passage means whereby fluid at reduced pressure from said cooling chamber may pass through said further passage means to said outlet in counterflow heat exchange relation with fluid in said first passage means for regenerative precooling, each of said passage means being of micron size whereby to promote laminar flow therein.

5. The refrigerator defined in claim 4, wherein said plates are thin glass plates of uniform thickness.

6. The refrigerator defined in claim 5, wherein said glass plates are about 0.020 inches thick.

7. The refrigerator defined in claim 4, wherein at least the plates in which said passage means are formed are of a low thermal conductivity material such as glass.

8. The refrigerator defined in claim 4, wherein each of said passage means is recessed into a plate surface.

9. The refrigerator defined in claim 4, wherein said inflow passage means are each about 250 microns wide and about 10 microns deep, said capillary passage means is about 200 microns wide and said about 10 microns deep and outflow passage means is about 15,000 microns wide and about 25 microns deep.

10. The refrigerator defined in claim 4, wherein said laminate is mounted at one end on a holder having bores therethrough connecting with said inlet and outlet.

11. The refrigerator defined in claim 10, in combination with an enclosure that is adapted to be connected to a source of vacuum, and means securing said holder within said enclosure so that the refrigerator has cantilever support in said enclosure.

12. The refrigerator defined in claim 4, wherein said plates are glass and said chamber is a through opening in one of said plates and a pad is bonded over said opening whereby to provide contact with a device to be cooled, said pad being of a material that is of higher thermal conductivity than the plate in which said opening is formed.

13. The refrigerator defined in claim 12, wherein said pad is of crystalline aluminum oxide, silicon or beryllium oxide.

14. The refrigerator defined in claim 4, wherein two adjacent plates are glass and the third plate is of a material having an appreciably higher coefficient of thermal conductivity, said first passage means being formed in the interface between said third plate and the glass plate is bonded to it.

15. A multilayer refrigerator as defined in claim 4, wherein said cooling chamber is substantially centrally located in said laminate and means is provided whereby an electrical device to be cooled may be secured directly on an outer plate substantially directly in line with said cooling chamber, electrical circuit means for said device being formed on the adjacent surface of said outer plate.

16. The refrigerator defined in claim 4, wherein said first passage means comprises a heat exchange section comprising a series of parallel channels extending in heat exchange relation with said further passage means and said capillary passage means comprises a smaller diameter convoluted section extending from the heat exchange section to said chamber.

17. A microminiature cryogenic refrigerator for cooling superconductor and like devices comprising a plurality of members having substantially the same coefficient of thermal expansion, means bonding said members together over parallel interface areas to form a laminate and means forming in said laminate a low temperature chamber connected with input and output fluid ports by respective supply and return fluid lines in the form of channels in or on said members at said interface areas, said supply line comprising a first section for conducting incoming highly compressed gas and a serially connected capillary section whereby the high-pressure gas is allowed to expand and reduce in temperature before entering said chamber, means whereby said chamber may be in heat exchange contact with a device to be cooled, and said return line having a section extending substantially coextensively in heat exchange relation adjacent the first section of said supply line but in a different plane in one laminate, the interfaces between said members being sealed pressure-tight except for said surface channels and ports.

18. The refrigerator defined in claim 17, wherein said members are thin plates of the same size having relatively low coefficient of thermal expansion such as glass.

19. The refrigerator defined in claim 17, wherein two of said bonded members are glass and adjacent in the laminate, said channels are recessed in surface of said members, and the other member is a plate having higher thermal conductivity.

20. A microminiature cryogenic refrigerator for cooling superconductors and like devices comprising a plurality of members having substantially the same coefficient of thermal expansion, means bonding said members together over prallel interface areas to form a laminate, means forming a low temperature chamber in said laminate, means forming a fluid supply passage connecting the exterior of said refrigerator to said chamber, said passage including in series a heat exchanger section and a capillary section, return passage means for conducting fluid from said cooling chamber in heat exchange relation with the incoming fluid in said heat exchange section and additional passage means for conducting a portion of said incoming fluid in bypass relation to said cooling chamber and passing said fluid portion to the exterior of said refrigerator in heat exchange relation with the incoming fluid in said heat exchange section.

21. The refrigerator according to claim 20 wherein said capillary section comprises two capillary passages in series and said additional passage means is connected to said capillary section at a point between said capillary passages.

22. The refrigerator according to claim 20 wherein said capillary section comprises two capillary passages arranged in parallel and said additional passage means is connected to the downstream end of one of said capillary passages.

* * * * *